(12) United States Patent
Higashi et al.

(10) Patent No.: US 7,840,299 B2
(45) Date of Patent: Nov. 23, 2010

(54) SUBSTRATE COLLECTION METHOD AND SUBSTRATE TREATMENT APPARATUS

(75) Inventors: Makio Higashi, Koshi (JP); Akira Miyata, Koshi (JP); Yoshitaka Hara, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 898 days.

(21) Appl. No.: 11/571,613

(22) PCT Filed: Jun. 23, 2005

(86) PCT No.: PCT/JP2005/011523
§ 371 (c)(1),
(2), (4) Date: Jan. 4, 2007

(87) PCT Pub. No.: WO2006/006364
PCT Pub. Date: Jan. 19, 2006

(65) Prior Publication Data
US 2008/0020315 A1    Jan. 24, 2008

(30) Foreign Application Priority Data
Jul. 7, 2004    (JP)    ............................... 2004-200544

(51) Int. Cl.
*G06F 19/00*    (2006.01)
*H01L 21/677*    (2006.01)
(52) U.S. Cl. .................... 700/112; 700/121; 414/935
(58) Field of Classification Search ............... 700/112, 700/108, 121; 414/935
See application file for complete search history.

(56) References Cited

U.S. PATENT DOCUMENTS

| 5,308,210 A | * | 5/1994 | Ohtani et al. | .......... 414/222.07 |
| 5,700,127 A | * | 12/1997 | Harada et al. | .......... 414/416.08 |
| 5,898,588 A | * | 4/1999 | Morimoto | .................... 700/108 |
| 6,391,113 B1 | * | 5/2002 | Konishi et al. | .............. 118/719 |

FOREIGN PATENT DOCUMENTS

| JP | 3 257945 | 11/1991 |
| JP | 9 17838 | 1/1997 |
| JP | 9 129707 | 5/1997 |
| JP | 2002 252263 | 9/2002 |
| JP | 2004 87795 | 3/2004 |

* cited by examiner

*Primary Examiner*—Albert DeCady
*Assistant Examiner*—Steven R Garland
(74) *Attorney, Agent, or Firm*—Oblon, Spivak, McClelland, Maier & Neustadt, L.L.P.

(57) ABSTRACT

When a trouble occurs in a substrate treatment apparatus, the substrate existing in the substrate treatment apparatus is quickly collected without exerting adverse effects on the subsequent substrate treatment to resume the substrate treatment early. At the time of occurrence of trouble in a coating and developing treatment apparatus, all of the substrates in the coating and developing treatment apparatus are collected to a transfer-in/out section using a transfer unit in the apparatus. In this event, each transfer unit transfers the substrate from each position at the time of occurrence of trouble in a direction toward the transfer-in/out section for collection. Further, the substrate under treatment in the treatment unit at the time of occurrence of trouble is collected after the treatment is finished.

14 Claims, 6 Drawing Sheets

SUBSTRATE COLLECTION METHOD AND SUBSTRATE TREATMENT APPARATUS

TECHNICAL FIELD

The present invention relates to a substrate collection method for collecting a substrate in an apparatus, and a substrate treatment apparatus.

BACKGROUND ART

The photolithography process in the manufacturing process of the semiconductor device is usually performed, for example, using a coating and developing treatment apparatus. The coating and developing treatment apparatus includes, for example, a transfer-in/out section for transferring in/out the substrate, a treatment section in which a plurality of treatment units for performing various kinds of treatments such as a resist coating treatment, a developing treatment, a thermal treatment, and so on are arranged, and an interface section for delivering the substrate between the treatment section and an aligner, in a casing. Further, the coating and developing treatment apparatus includes a plurality of transfer units for transferring the substrate between the sections and between the treatment units, for example, in the casing.

Then, during the normal operation of the above-described coating and developing treatment apparatus, a plurality of substrates transferred into the transfer-in/out section are sequentially transferred by the transfer units into the treatment section, and a predetermined treatment is performed for each of the substrates in each of the treatment units in the treatment section, such as the resist coating treatment, thermal treatment and so on. Thereafter each substrate is transferred via the interface section into the aligner where the substrate is subjected to exposure processing, and then returned into the treatment section where the substrate is subjected to predetermined treatments such as the developing treatment and so on and then returned to the transfer-in/out section.

Incidentally, if a trouble such as a breakdown occurs in the treatment unit in operation in the above-described coating and developing treatment apparatus, it is necessary to stop the coating and developing treatment apparatus and repair the broken treatment unit. In this event, many substrates remain in the coating and developing treatment apparatus. These substrates have been collected to the transfer-in/out section, for example, by collection operation manipulated by an operator in order to return the coating and developing treatment apparatus into a normal state and resume the normal substrate treatment (see, for example, Patent Document 1).

However, if a trouble occurs when a plurality of substrates are under treatment in a single processing manner in the above-described coating and developing treatment apparatus, the substrates are in various states. For example, in the developing unit, a developing solution may be placed on the front surface of the substrate. Besides, in the thermal treatment unit, the substrate may be raised to a high temperature. If the substrates in such unexpected various states are collected, for example, the transfer unit and the delivery unit for delivering the substrate which are used for collection are contaminated with the developing solution on the substrate or thermally affected by the substrate at the high temperature. Therefore, even after solution of the trouble, the transfer unit and the delivery unit in the coating and developing treatment apparatus may be contaminated or unstable in temperature to adversely affect the substrate treatment after resumption. Further, if maintenance of the transfer unit and the delivery unit is performed to prevent such effects, it takes a long time from the occurrence of trouble to return of the coating and developing treatment apparatus into a normal state and resume the substrate treatment, resulting in reduced substrate production efficiency.

[Patent Document]
Japanese Patent Application Laid-open No. H9-17838

DISCLOSURE OF THE INVENTION

Problems to be Solved by the Invention

The present invention has been developed in consideration of the above point and its object is to provide a substrate collection method and a substrate treatment apparatus each capable of, at the time of occurrence of trouble in the substrate treatment apparatus such as a coating and developing treatment apparatus, collecting a substrate remaining in the substrate treatment apparatus without exerting adverse effects on the subsequent substrate treatment to resume the substrate treatment early.

Means for Solving the Problems

To achieve the above object, the present invention is a method of collecting a substrate in a substrate treatment apparatus to a transfer-in/out section, the substrate treatment apparatus including the transfer-in/out section for transferring in/out the substrate, a treatment section including a plurality of treatment units for treating the substrate, and a substrate transfer means capable of sequentially transferring the substrate transferred-in from the transfer-in/out section to the treatment units in the treatment section and returning the substrate subjected to predetermined treatments in the treatment section to the transfer-in/out section, characterized in that when a trouble occurs in the substrate treatment apparatus, all of the substrates existing in the substrate treatment apparatus are collected by the substrate transfer means to the transfer-in/out section, and that the substrate under treatment in the treatment unit out of the substrates to be collected is collected after the treatment in the treatment unit is finished. Note that the "trouble" includes not only the case in which various kinds of sources in the substrate treatment apparatus but also the case in which the substrate treatment performed in the substrate treatment apparatus is not appropriately performed.

According to the present invention, when a trouble occurs in the substrate treatment apparatus, the substrate under treatment in the substrate treatment apparatus is collected after the treatment is finished, so that the substrate can be collected after the treatment in the treatment unit is completely finished and a state in which no averse effects are exerted on the substrate transfer means is established. Further, since the substrate to be collected does not adversely affect the substrate transfer means, there is no need to perform maintenance on the substrate transfer means after the collection of the substrate, so that the treatment of the substrate and the transfer of the substrate in the substrate treatment apparatus can be resumed early after the trouble is solved. Accordingly, the substrate treatment can be resumed early to improve the substrate production efficiency.

The substrate which is being subjected to solution treatment in a solution treatment unit included in the treatment section may be collected after the solution treatment is finished and the substrate is dried. In this case, the liquid adhering to the collected substrate never contaminates the substrate transfer means such as a transfer arm.

Further, the substrate which is being subjected to heat treatment in a thermal treatment unit included in the treatment section may be collected after the heat treatment is finished and the substrate is cooled. In this case, the substrate transfer means is never thermally affected by the heat of the substrate to be collected.

At normal time (or in other words, during normal operation), the substrate transferred into the transfer-in/out section may be transferred by the substrate transfer means to the plurality of treatment units along a predetermined transfer route, and if the trouble occurs, the substrate in the substrate treatment apparatus may be transferred by the substrate transfer means along the predetermined transfer route with a predetermined treatment unit on the predetermined transfer route omitted. In this case, since transfer is performed taking a so-called shortcut of the transfer route at the normal time, the substrate can be quickly collected. Further, since the substrate is collected along the transfer route, another substrate can be transferred into the substrate treatment apparatus and treatments can also be started without waiting for all of the substrates in the substrate treatment apparatus to be collected.

At normal time, the substrate transferred into the transfer-in/out section may be transferred by the substrate transfer means to the plurality of treatment units along a predetermined transfer route, and if the trouble occurs, the substrate in the substrate treatment apparatus may be transferred by the substrate transfer means not along the predetermined transfer route but from a position of each substrate in a direction toward the transfer-in/out section. In this case, since each substrate is transferred in the direction toward the transfer-in/out section for collection even if it is at any position in the substrate treatment apparatus at the time of occurrence of trouble, the collection of the substrate can be quickly performed.

If the trouble occurs, the substrate existing in the treatment unit in the treatment section may be transferred by the substrate transfer means to an empty treatment unit closer to the transfer-in/out section.

If there are a plurality of the empty treatment units, the substrate may be transferred to the empty treatment unit closest to the substrate.

When the trouble occurs, the substrate existing in the treatment unit being a cause of the occurrence of trouble is not collected but all of the other substrates are collected, and the substrate existing in the treatment unit being the cause of the occurrence of trouble may be collected using the substrate transfer means after the trouble is solved. This allows the substrate in the treatment unit being the cause of occurrence of trouble to be collected using the substrate transfer means.

The present invention according to another aspect is a substrate treatment apparatus including a transfer-in/out section for transferring in/out a substrate, a treatment section including a plurality of treatment units for treating the substrate, and a substrate transfer means capable of sequentially transferring the substrate transferred-in from the transfer-in/out section to the treatment units in the treatment section and returning the substrate subjected to predetermined treatments in the treatment section to the transfer-in/out section, in a casing, characterized by including a substrate collection control unit for controlling the substrate transfer means such that when a trouble occurs, all of the substrates existing in the casing are collected by the substrate transfer means to the transfer-in/out section, and the substrate under treatment in the treatment unit out of the substrates to be collected is collected after the treatment in the treatment unit is finished.

According to the present invention, when a trouble occurs, the substrate under treatment in the treatment unit in the casing can be collected after the treatment is finished, so that the substrate can be collected after the treatment in the treatment unit is completely finished and a state in which no averse effects are exerted on the substrate transfer means is established. Further, since the substrate to be collected does not adversely affect the substrate transfer means, there is no need to perform maintenance on the substrate transfer means after the collection of the substrate, so that the treatment of the substrate and the transfer of the substrate in the substrate treatment apparatus can be resumed early after the trouble is solved. Accordingly, the substrate treatment can be resumed early to improve the substrate production efficiency.

The treatment section may include a solution treatment unit for performing a solution treatment for the substrate, and the substrate collection control unit may control the substrate transfer means to collect the substrate which is being subjected to the solution treatment in the solution treatment unit at the time of occurrence of trouble after the solution treatment is finished and the substrate is dried. In this case, the liquid adhering to the collected substrate never contaminates the substrate transfer means such as a transfer arm.

The treatment section may include a thermal treatment unit for performing heat treatment for the substrate, and the substrate collection control unit may collect the substrate which is being subjected the heat treatment in the thermal treatment unit at the time of occurrence of trouble after the heat treatment is finished and the substrate is cooled. In this case, the substrate transfer means is never thermally affected by the heat of the substrate to be collected.

At normal time, the substrate transfer means transfers the substrate to the plurality of treatment units along a predetermined transfer route, and if the trouble occurs, the substrate collection control unit may cause the substrate transfer means to transfer the substrate in the casing along the predetermined transfer route with a predetermined treatment unit on the predetermined transfer route omitted. In this case, since transfer is performed taking a so-called shortcut of the transfer route at the normal time, the substrate can be quickly collected. Further, since the substrate is collected along the transfer route, another substrate can be transferred into the substrate treatment apparatus and treatments can also be started without waiting for all of the substrates in the substrate treatment apparatus to be collected.

At normal time, the substrate transfer means transfers the substrate to the plurality of treatment units along a predetermined transfer route, and if the trouble occurs, the substrate collection control unit may control the substrate transfer means such that the substrate in the casing is transferred by the substrate transfer means not along the predetermined transfer route but from a position of each substrate in a direction toward the transfer-in/out section. In this case, since each substrate is transferred in the direction toward the transfer-in/out section for collection even if it is at any position in the substrate treatment apparatus at the time of occurrence of trouble, the collection of the substrate can be quickly performed.

If the trouble occurs, the substrate existing in the treatment unit in the treatment section may be transferred by the substrate transfer means to an empty treatment unit closer to the transfer-in/out section than the treatment unit. If there are a plurality of the empty treatment units, the substrate may be transferred by the substrate transfer means to the empty treatment unit closest to the substrate.

When the trouble occurs, the substrate collection control unit does not collect the substrate existing in the treatment unit being a cause of the occurrence of trouble but collects all of the other substrates, and may collect the substrate existing in the treatment unit being the cause of the occurrence of trouble by the substrate transfer means after the trouble is solved.

Effect of the Invention

According to the present invention, even if a trouble occurs, the substrate treatment in the substrate treatment apparatus can be resumed early, thereby improving the substrate production efficiency.

Figure 1:
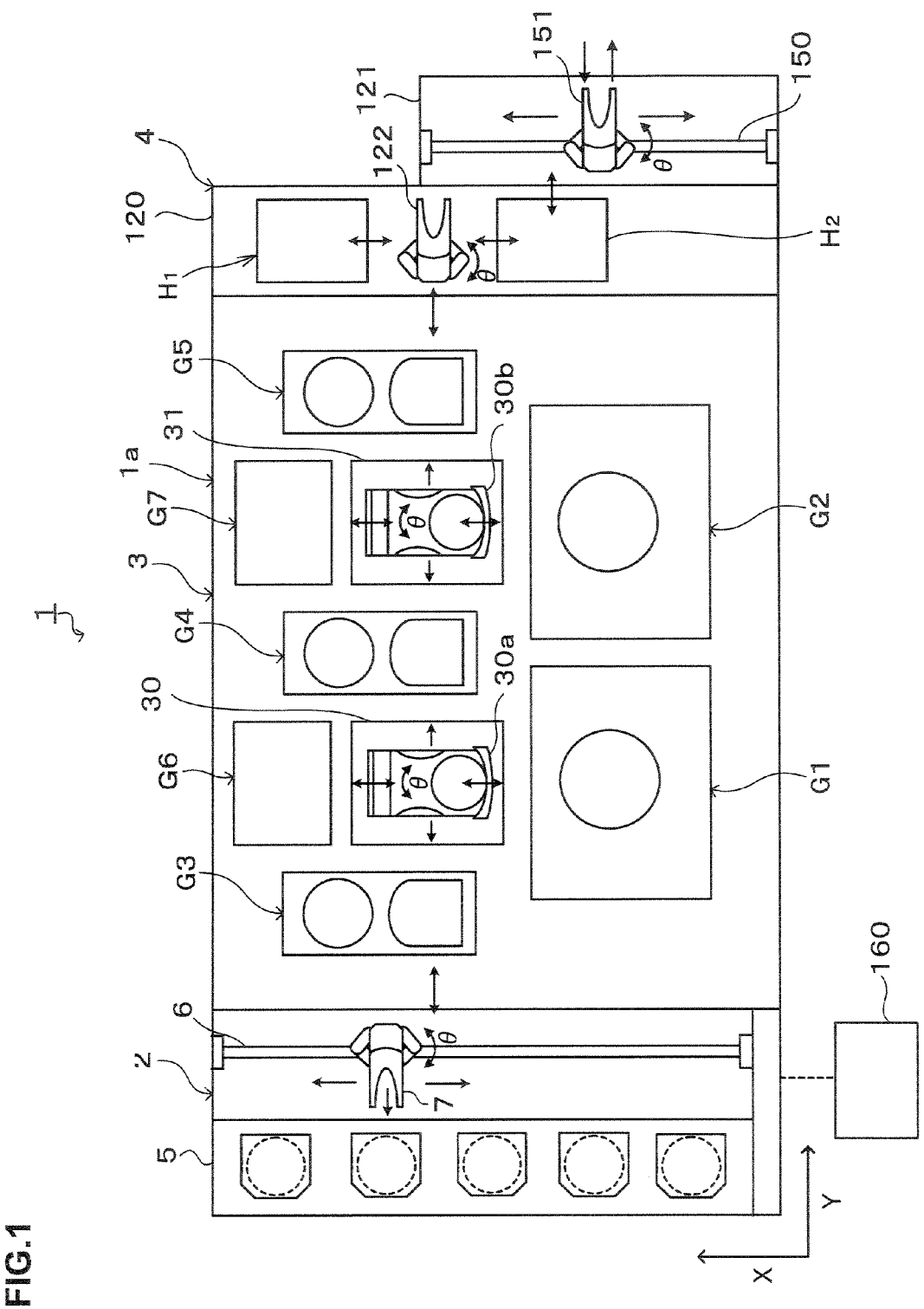
FIG. 1 A plan view showing the outline of a coating and developing treatment apparatus according to the present embodiment.

EXPLANATION OF CODES 1 substrate treatment apparatus
2 cassette station
3 treatment station
30 first transfer unit
31 second transfer unit
160 control unit
W wafer

DETAILED DESCRIPTION

Figure 2:
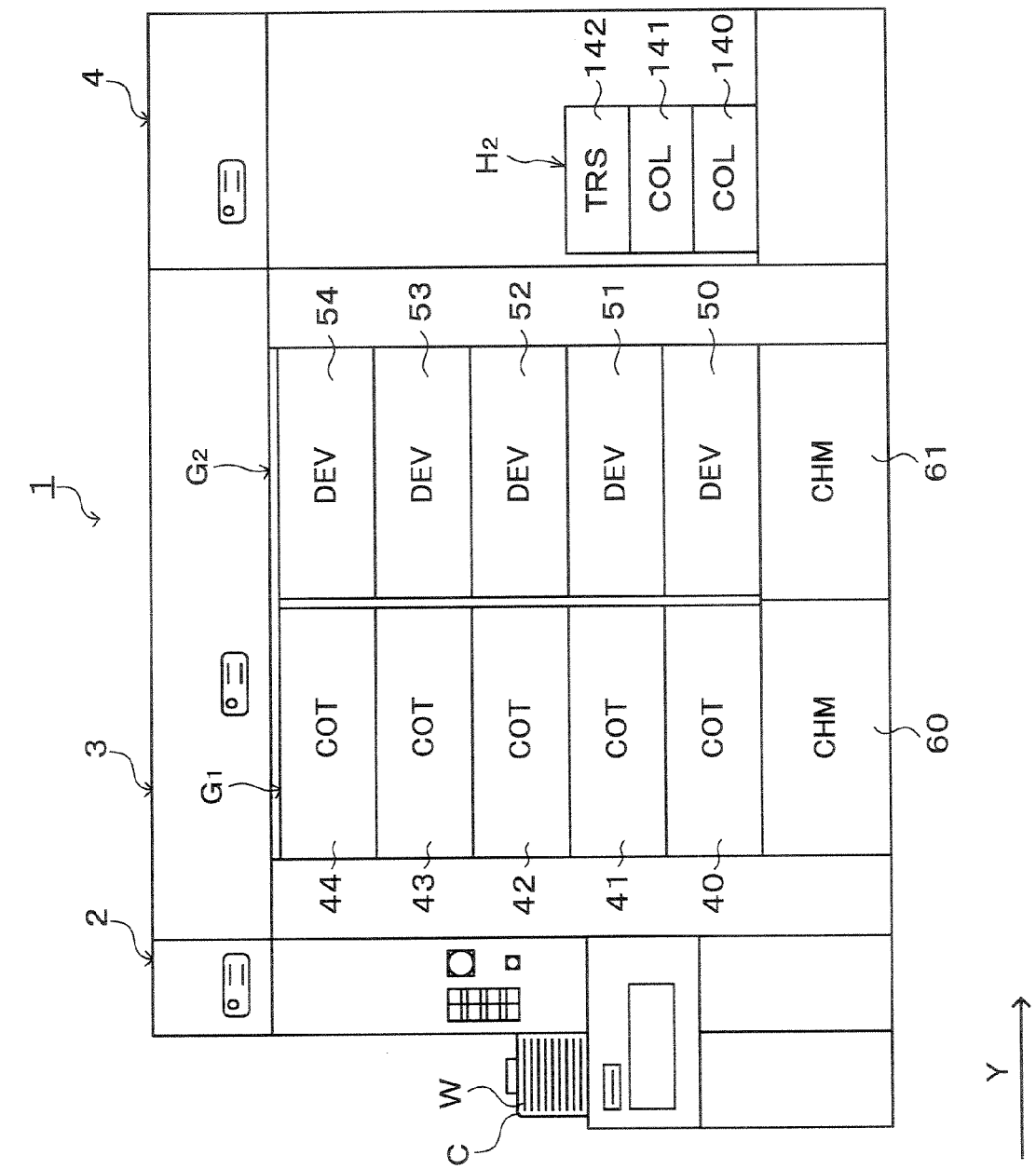
FIG. 2 A front view of the coating and developing treatment apparatus in FIG. 1.
Figure 3:
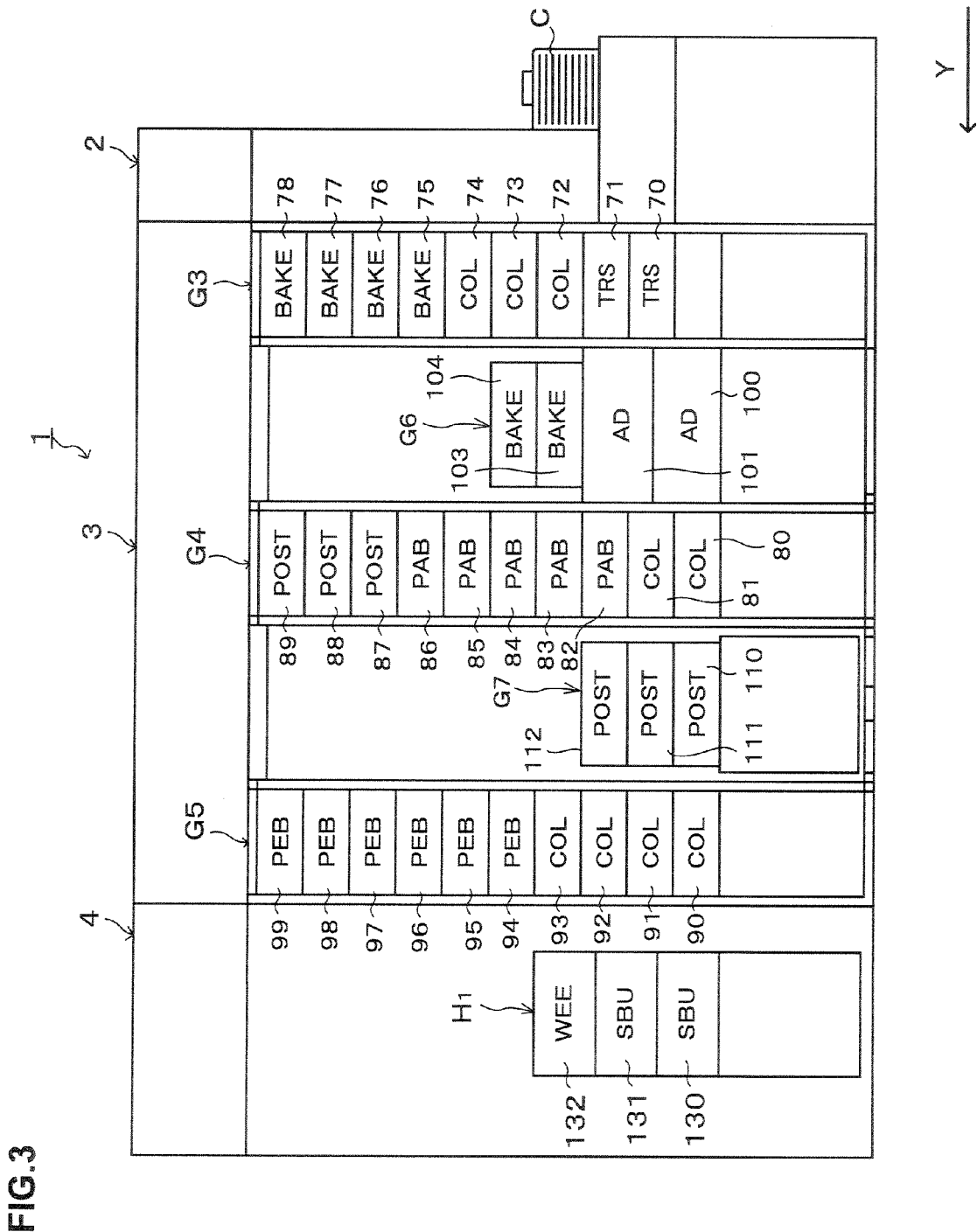
FIG. 3 A rear view of the coating and developing treatment apparatus in FIG. 1.

Hereinafter, a preferred embodiment of the present invention will be described. FIG. 1 is a plan view showing the outline of a configuration of a coating and developing treatment apparatus 1 as a substrate treatment apparatus according to the present embodiment, FIG. 2 is a front view of the coating and developing treatment apparatus 1, and FIG. 3 is a rear view of the coating and developing treatment apparatus 1.

The coating and developing treatment apparatus 1 has a configuration, for example, in a casing 1a (or housing) as a housing covering the entire apparatus as shown in FIG. 1, in which a cassette station 2 as a transfer-in/out section for transferring, for example, 25 wafers W per cassette as a unit from/to the outside into/from the coating and developing treatment apparatus 1 and transferring the wafers W into/out of a cassette C; a treatment station 3 including a plurality of various kinds of treatment units, which are multi-tiered, for performing predetermined treatments in a manner of single wafer processing in the coating and developing steps; and an interface section 4 for delivering the wafers W to/from a not-shown aligner provided adjacent to the treatment station 3, are integrally connected together.

In the cassette station 2, a plurality of cassettes C can be mounted at predetermined positions on a cassette mounting table 5 in a line in an X-direction (a top-to-bottom direction in FIG. 1). In the cassette station 2, a wafer transfer unit 7 is provided which is movable in the X-direction on a transfer path 6. The wafer transfer unit 7 is also movable in the vertical direction and thus can selectively access the wafers W arranged in the vertical direction in the cassette C. The wafer transfer unit 7 is also rotatable around the axis in the vertical direction (a θ-direction) and thus can access later-described units included in a third treatment unit group G3 on the treatment station 3 side.

The treatment station 3 includes, for example, seven treatment unit groups G1 to G7 in each of which a plurality of treatment units are multi-tiered as shown in FIG. 1. On the side of the negative direction in the X-direction (the downward direction in FIG. 1) being on the Font side in the treatment station 3, the first treatment unit group G1 and the second treatment unit group G2 are placed in order from the cassette station 2 side. At the central portion of the treatment station 3, the third treatment unit group G3, the fourth treatment unit group G4, and the fifth treatment unit group G5 are placed in order from the cassette station 2 side. On the side of the positive direction in the X-direction (the upward direction in FIG. 1) being on the rear side in the treatment station 3, the sixth treatment unit group G6 and the seventh treatment unit group G7 are placed in order from the cassette station 2 side.

Between the third treatment unit group G3 and the fourth treatment unit group G4, a first transfer unit 30 is provided. The first transfer unit 30 includes a transfer arm 30a which is, for example, rotatable in the θ-direction and movable in the horizontal direction and the vertical direction. The first transfer unit 30 can move the transfer arm 30a back and forward with respect to the units in the adjacent first treatment unit group G1, third treatment unit group G3, fourth treatment unit group G4 and sixth treatment unit group G6 to thereby transfer the wafer W between the units in the treatment unit groups G1, G3, G4, and G6.

Between the fourth treatment unit group G4 and the fifth treatment unit group G5, a second transfer unit 31 is provided. The second transfer unit 31 includes a transfer arm 31a, similarly to the first transfer unit 30, and can selectively access the units in the second treatment unit group G2, fourth treatment unit group G4, fifth treatment unit group G5, and seventh treatment unit group G7 and transfer the wafer W to them.

In the first treatment unit group G1, as shown in FIG. 2, solution treatment units each for supplying a predetermined liquid to the wafer W to perform treatment, for example, resist coating units 40 to 44 each for applying a resist solution to the wafer W to form a resist film are five-tiered in order from the bottom. In the second treatment unit group G2, solution treatment units, for example, developing units 50 to 54 each for developing the wafer W are five-tiered in order from the bottom. Further, chemical chambers 60 and 61 each for supplying various kinds of treatment solutions to the solution treatment units in the treatment unit groups G1 and G2 are provided at the lowermost tiers of the first treatment unit group G1 and the second treatment unit group G2, respectively.

As shown in FIG. 3, in the third treatment unit group G3, for example, transition units 70 and 71 each for passing the wafer W, cooling units 72 to 74 each for cooling the wafer W under a temperature control with a high precision, and high-temperature heat treatment units 75 to 78 each for heat-treating the wafer W at a high temperature, are nine-tiered in order from the bottom. Each of the transition units 70 and 71 has transfer ports for the wafer W on both sides in the Y-direction to allow both the wafer transfer unit 7 and the first transfer unit 30 adjacent thereto in the Y-direction to access it. Accordingly, each of the transition units 70 and 71 have a function of passing the wafer W between the wafer transfer unit 7 and the first transfer unit 30.

In the fourth treatment unit group G4, for example, cooling units 80 and 81, pre-baking units 82 to 86 each for heat-treating the wafer W after resist coating treatment, and post-baking units 87 to 89 each for heat-treating the wafer W after developing treatment, are ten-tiered in order from the bottom. Every unit in the fourth treatment unit group G4 has transfer ports for the wafer W on both sides in the Y-direction to allow both the first transfer unit 30 and the second transfer unit 31 adjacent thereto on both sides in the Y-direction to access it. Accordingly, every unit in the fourth treatment unit group G4 has a function of passing the wafer W between the first transfer unit 30 and the second transfer unit 31.

In the fifth treatment unit group G5, for example, cooling units 90 to 93, post-exposure baking units 94 to 99 as heat treatment units each for heat-treating the wafer W after exposure, are ten-tiered in order from the bottom. Each of the post-exposure baking units 94 to 99 has, for example, a heating plate for mounting the wafer W thereon to heat the wafer W and a cooling plate for mounting the wafer W thereon to cool the wafer W in a container so that it can both heat and cool the wafer W. For example, every unit in the fifth treatment unit group G5 has transfer ports for the wafer W on both sides in the Y-direction and thus has a function of passing the wafer W between the second transfer unit 31 and a later-described first wafer transfer unit 122 in the interface section 4.

In the sixth treatment unit group G6, as shown in FIG. 3, for example, adhesion units 100 and 101 each for performing hydrophobic treatment for the wafer W and heat treatment units 102 and 103 each for heat-treating the wafer W are four-tiered in order from the bottom.

In the seventh treatment unit group G7, as shown in FIG. 3, for example, post-baking units 110 to 112 are three-tiered in order from the bottom.

The interface section 4 includes, as shown in FIG. 1, for example, a first interface section 120 and a second interface section 121 from the treatment station 3 side. In the first interface section 120, for example, a first wafer transfer unit 122 is provided at a position corresponding to the fifth treatment unit group G5. For example, two unit groups H1 and H2 are arranged on both sides in the X-direction of the first wafer transfer unit 122.

In the unit group H1 on the positive direction side in the X-direction, for example, buffer cassette units 130 and 131 and an edge exposure unit 132 for selectively exposing only the outer peripheral portion of the wafer W to light are arrange in order from the bottom as shown in FIG. 3. In the unit group H2 on the negative direction side in the X-direction, for example, cooling units 140 and 141 and a transition unit 142 are arrange in order from the bottom as shown in FIG. 2.

As shown in FIG. 1, the first wafer transfer unit 122 is movable, for example, in the horizontal direction and the vertical direction and rotatable in the θ-direction and thus can access the units in the fifth treatment unit group G5, the unit group H1 and the unit group H2.

In the second interface section 121, for example, a second wafer transfer unit 151 moving on a transfer path 150 provided toward the X-direction is provided. The wafer transfer unit 151 is movable in the Z-direction and rotatable in the θ-direction and thus can access the units in the unit group H2 and the not-shown aligner adjacent to the second interface section 121. Accordingly, the wafer W in the treatment station 3 can be transferred between the treatment station 3 and the aligner by the first and second wafer transfer units 121 and 151.

Note that the wafer transfer unit 7, the first transfer unit 30, the second transfer unit 31, the first wafer transfer unit 122, and the second wafer transfer unit 151 constitute a substrate transfer means in the present embodiment.

The control of the wafer treatment and the wafer transfer conducted in the coating and developing treatment apparatus 1 is performed, for example, by a control unit 160 as a substrate collection control unit shown in FIG. 1. In the control unit 160, a predetermined transfer route is set, for example, for the units in the coating and developing treatment apparatus 1 for each lot of the wafers W. The control unit 160 can control operations of the transfer units 7, 30, 31, 122, and 151 in the coating and developing treatment apparatus 1 to transfer the wafer W according to the set transfer route to thereby perform predetermined treatments on the wafer W.

Further, in the control unit 160, a wafer collection function is set which collects the wafer W in the coating and developing treatment apparatus 1 when a trouble occurs in the coating and developing treatment apparatus 1, such as when the treatment unit breaks down The control unit 160 can operate the wafer collection function to output a wafer collection command, for example, to the transfer units 7, 30, 31, 122, and 151 in the coating and developing treatment apparatus 1 to thereby control the operations of the transfer units, thereby collecting all of the wafers W existing in the coating and developing treatment apparatus 1 in a direction toward the cassette station 2. In this event, the control unit 160 can transfer the wafer W, for example, into an empty unit closer to the cassette station 2 using the transfer units. When there are a plurality of empty units, the control unit 160 can transfer a wafer W to a unit located at a shortest distance from the position of that wafer. The control unit 160 can also collect the wafers W, which are under treatment in the treatment units at the time of occurrence of a trouble, after the treatments in the treatment units are finished.

Figure 4:
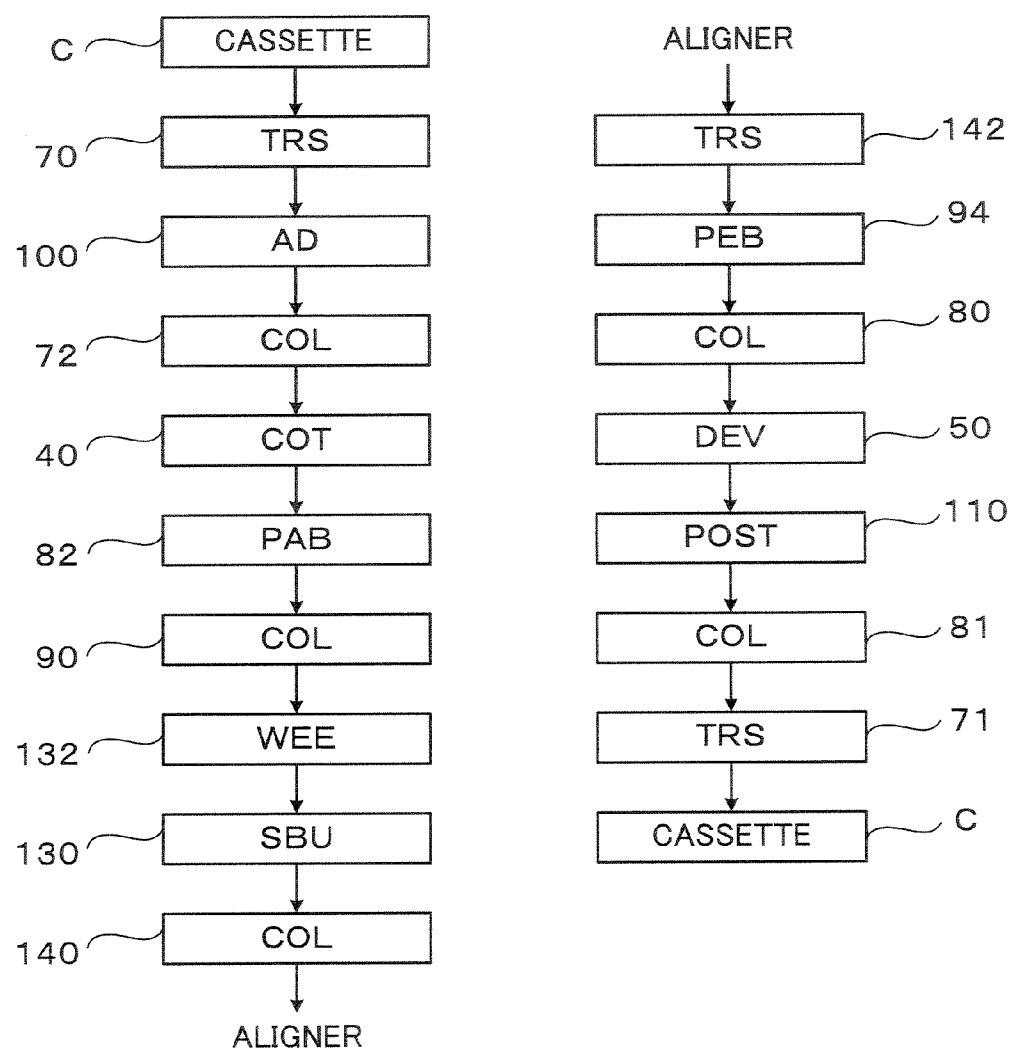
FIG. 4 An explanatory view showing a transfer route for a wafer at the time of treatment.

Here, one example of the wafer treatment performed in the coating and developing treatment apparatus 1 configured as described above. Once a cassette C housing a plurality of untreated wafers is mounted on the mounting table 6 in the cassette station 2, the wafers W in the cassette C are transferred along the predetermined transfer route previously set for each lot and treated. FIG. 4 shows one example of the transfer route for the wafer W.

For example, when, first of all, one wafer W is taken out of the cassette C, it is transferred by the wafer transfer unit 7 to the transition unit 70 in the third treatment unit group G3. The wafer W transferred to the transition unit 70 is transferred by the first transfer unit 30 to the adhesion unit 100 in the sixth treatment unit group G6, where, for example, HMDS is applied on the wafer W to enhance the adhesiveness between the wafer W and the resist solution. Subsequently, the wafer W is transferred by the first transfer unit 30 to the cooling unit 72 in the third treatment unit group G3 where the wafer W is cooled, and then transferred by the first transfer unit 30 to the resist coating unit 40 in the first treatment unit group G1 where the wafer W is subjected to the resist coating treatment.

The wafer W subjected to the resist coating treatment is transferred by the first transfer unit 30 to the pre-baking unit 82 in the fourth treatment unit group G4 where the wafer W is heated and dried, and then transferred by the second transfer unit 31 to the cooling unit 90 in the fifth treatment unit group G5 where the wafer W is cooled. The wafer W is then transferred by the first wafer transfer unit 122 in the first interface section 121 to the edge exposure unit 132 in the unit group H1 where the wafer W is subjected to edge exposure treatment, and then housed in the buffer cassette unit 130. The wafer W is then transferred by the wafer transfer unit 122 to the cooling unit 140 in the unit group H2, and transferred by the second wafer transfer unit 151 in the second interface section 121 to the not-shown aligner. The wafer W for which the exposure processing has been finished in the aligner is transferred by the second wafer transfer unit 151 to the transition unit 142 in the first interface section 120, and then transferred by the first wafer transfer unit 122 to the post-exposure baking unit 94 in the fifth treatment unit group G5. The wafer W heated in the post-exposure baking unit 94 is transferred by the second transfer unit 31 to the cooling unit 80 in the fourth treatment unit group G4 where the wafer W is cooled, and then transferred to the developing unit 50 in the second treatment unit group G2 where the wafer W is developed.

The wafer W for which the developing treatment has been finished is transferred by the second transfer unit 31 to the post-baking unit 110 in the seventh treatment unit group G7 where the wafer W is subjected to heat treatment, and then transferred to the cooling unit 81 in the fourth treatment unit group G4 where the wafer W is cooled. The wafer W is then transferred by the first transfer unit 30 to the transition unit 71 in the third treatment unit group G3, and subsequently returned by the wafer transfer unit 7 into the cassette C in the cassette station 2. Thus, a series of photolithography steps for the wafer W is completed.

In the coating and developing treatment apparatus 1, a plurality of wafers W in the cassette C are transferred in sequence to the treatment station 3 side so that the wafers W are sequentially processed along the transfer route in a manner of single wafer processing.

Figure 5:
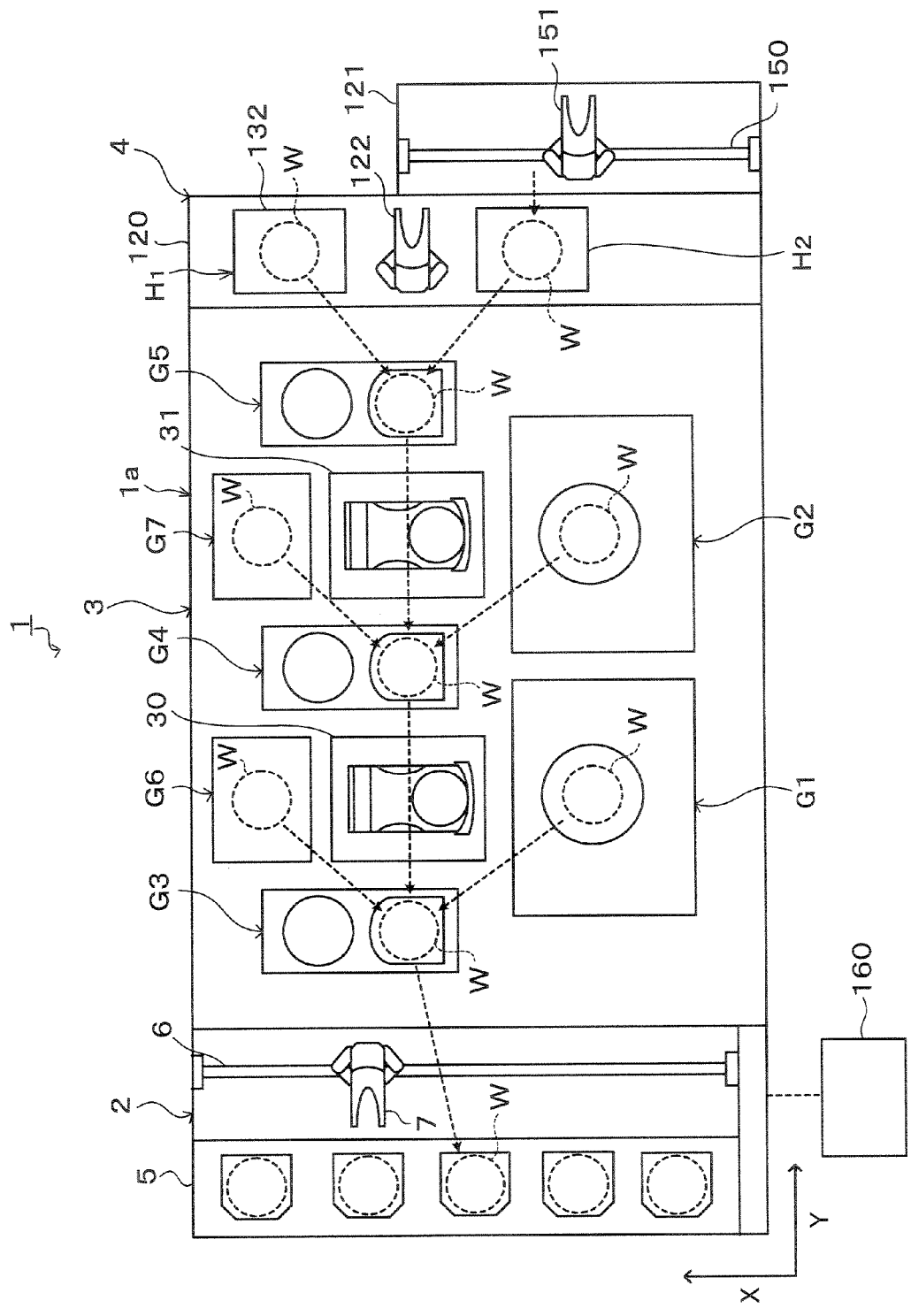
FIG. 5 A plan view of the coating and developing treatment apparatus for showing a collection path for the wafer.

If a trouble occurs in the above-described coating and developing treatment apparatus 1, the control unit 160 operates the wafer collection function. The operation of the wafer collection function may be automatically performed when an alarm is outputted which notifies the occurrence of the trouble or may be performed by the operation by an operator. Once the wafer collection function operates, all of the wafers W existing in the coating and developing treatment apparatus 1 are transferred toward the cassette station 2 side, for example, as shown in FIG. 5. In this event, the wafers W under treatment, for example, in the treatment units in the treatment station 3 and the interface section 4 are transferred after the treatments are finished. For example, the wafer W on which a developing solution is placed during development in the developing unit 50 at the time of occurrence of the trouble is continuously subjected to the developing treatment until the static development is finished and the developing solution is shaken out for dry, and the wafer W is then transferred toward the cassette station 2 after the completion of the developing treatment. Besides, the wafer W during cooling in the cooling unit 72, 80, or 81 at the time of occurrence of the trouble is continuously subjected to the cooling treatment until its temperature is lowered to a set temperature, and the wafer W is then transferred toward the cassette station 2 after the completion of the cooling treatment.

Here, the collection path of the wafer W to be collected by the above-described wafer collection function will be described.

First of all, the collection path for the wafer W existing in the unit group H1 or H2 in the interface section 4 at the time of occurrence of trouble will be described. The wafer W housed in the edge exposure unit 132 in the unit group H1 at the time of occurrence of trouble is first transferred by the first wafer transfer unit 122 to any of the treatment units 90 to 99 having the passing function in the fifth treatment unit group G5 closer to the cassette station 2 not along the transfer route at the normal time. The wafer W in this event is transferred to an empty one of the treatment units 90 to 99. If there is no empty treatment unit, as soon as any one of the treatment units 90 to 99 becomes empty, the wafer W is transferred to that empty treatment unit. Besides, if there are a plurality of empty treatment units, the wafer W is transferred to a unit located at a shortest distance from, for example, the edge exposure unit 132, such as a predetermined treatment unit located at a similar height.

After the wafer W is transferred from, for example, the edge exposure unit 132 to any one of the treatment units 90 to 99 in the fifth treatment unit group G5, the wafer W is subsequently transferred by the second transfer unit 31 to any one of the treatment units 80 to 89 having a passing function in the fourth treatment unit group G4 closer to the cassette station 2. Also in this event, if there is no empty treatment unit, as soon as any treatment unit becomes empty, the wafer W is transferred to that empty treatment unit. If there are a plurality of empty treatment units, the wafer W is transferred to a unit located at a shortest distance.

Similarly, the wafer W transferred to any one of the treatment units 80 to 89 in the fourth treatment unit group G4 is transferred by the first transfer unit 30 to any one of the transition units 70 and 71 having the passing function in the third treatment unit group G3 closer to the cassette station 2. Also in this event, when there are other wafers W in both the transition unit 70 and 71, as soon as the other wafer W is transferred out and that transition unit becomes empty, the former wafer W is transferred to that empty transition unit. If both the transition units 70 and 71 are empty, the wafer W is transferred to the unit located at a shortest distance therefrom. The wafer W transferred to one of the transition units 70 and 71 in the third treatment unit group G3 is transferred by the wafer transfer unit 7 to the cassette C and collected into it.

The wafers W existing in the treatment unit groups G3 to G5 at the time of occurrence of trouble are collected along the collection path for the wafers W existing in the units H1 and H2. Besides, the wafer W existing in the treatment unit group G2 or G7 is transferred by the second transfer unit 31 to any one of the empty treatment units 80 to 89 in the fourth treatment unit group G4, and then transferred along the above-described collection path. Further, the wafer W existing in the treatment unit group G1 or G6 at the time of occurrence of trouble is transferred by the first transfer unit 30 to any one of the empty extension units 70 and 71 in the third treatment unit group G3 and then collected along the above-described collection path.

As described above, the wafers W existing in the coating and developing treatment apparatus 1 at the time of occurrence of trouble are sequentially transferred using the transfer units to the units closer to the cassette station 2 side from the positions at that time and then linearly transferred toward the cassette station 2. Thus, all of the wafers W in the coating and developing treatment apparatus 1 are collected by the wafer collection function.

According to the above embodiment, since the wafer collection function is provided in the coating and developing treatment apparatus 1, all of the wafers W in the coating and developing treatment apparatus 1 can be quickly collected even if any trouble occurs. Further, since the wafer W under treatment in the treatment unit such as the developing unit 50 or the cooling unit 72, 80 or 81 is collected after the treatment is finished, each transfer unit never transfers a wafer W in an unexpected state, thereby making it possible to prevent the transfer units and the units of transfer destination from being contaminated with the developing solution and to suppress thermal adverse effects exerted on them. Accordingly, it is not necessary to perform maintenance of the transfer units and the treatment units accompanying the collection of the wafers W, so that the wafer treatment in the coating and developing treatment apparatus 1 can be resumed early. As a result, the efficiency of producing the wafers W can be improved.

In the above embodiment, since the wafers W remained in the coating and developing treatment apparatus 1 are transferred toward the cassette station 2 and collected not along the transfer route at the normal time, the collection of the wafers W can be performed in a short time. Further, each transfer unit transfers the wafer W as soon as the unit of transfer destination becomes empty, and if there are a plurality of empty units, the transfer unit transfers the wafer W to the unit located at the shortest distance, whereby the collection of the wafer W can be performed in a shorter time.

Even if the wafer W is under developing treatment at the time of occurrence of trouble, the wafer W is collected after the wafer W is subjected to drying in the developing unit 50 so that the solution treatment is finished in the above embodiment. However, for the solution treatment unit where drying of the wafer W is performed in another treatment unit, such as the resist coating unit, the wafer W may be collected after the wafer W is transferred to the other treatment unit and is subjected to drying in the treatment unit. For example, the wafer W under resist coating treatment in the resist coating unit 40 may be collected after it is transferred to the pre-baking unit 82 where the wafer W is dried.

Besides, while the wafer W is collected after the wafer W is cooled to the set temperature in the cooling unit 72 or the like in the above embodiment, the wafer W may be collected after it is heated to the predetermined temperature in other heat treatment unit, such as the heat treatment units 82, 94, or 110 which heats the wafer W. In such a case, a wafer W at an unexpected temperature is never transferred, thereby making it possible to suppress thermal adverse effects exerted on the transfer units and the units of transfer destination. Further, the wafer W heated in the heat treatment unit may be collected after it is cooled without fail. In this case, the thermal adverse effect exerted on the transfer units and the units of transfer destination can be minimized. When the heated wafer W is collected after it is cooled, the wafer W may be heated and cooled in the same heat treatment unit which is a heat treatment unit having both the heating function and the cooling function. Alternatively, in the heat treatment unit having no cooling function, the wafer W may be transferred to the cooling unit where it is cooled, and then collected.

Figure 6:
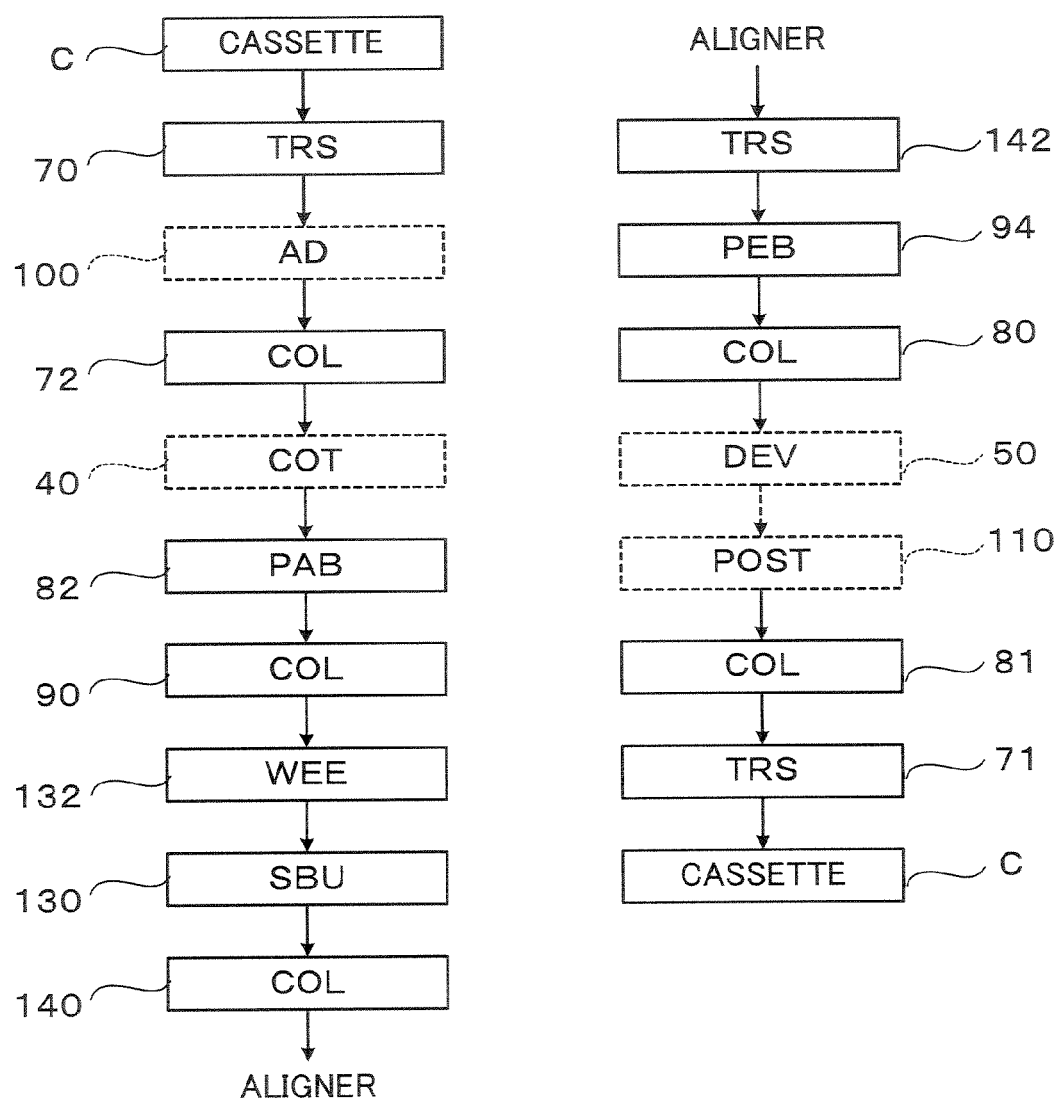
FIG. 6 An explanatory view showing a shortcut transfer route.

While the wafer collection function is set in the control unit 160 which collects the wafers W at the time of occurrence of trouble along the collection path independent from the transfer route at the normal time in the above embodiment, a wafer collection function may be set which collects the wafers W taking a shortcut along the transfer route at the normal time. In this case, the operation of the wafer collection function by the control unit 160 transfers the wafers W along the transfer route at the normal time with predetermined units along the transfer route omitted. For example, along the above-described transfer route, transfer of the wafers W to the units in the treatment unit groups G1, G2, G6 and G7, for example, transfer of the wafers W to the resist coating unit 40, the developing unit 50, the adhesion unit 100 and the post-baking unit 110 are omitted. Accordingly, as shown, for example, in FIG. 6, the wafer W at the time of occurrence of trouble is transferred to the cooling unit 72 subsequent to the transition unit 70, and transferred to the pre-baking unit 82 subsequent to the cooling unit 72, and transferred to the cooling unit 81 subsequent to the cooling unit 80. According to this example, since the wafer W is collected along the transfer route at the normal time, the control relating to the wafer transfer at the time of collecting can be performed more easily. Further, before finish of collection of all the wafers W existing in the coating and developing treatment apparatus 1, other wafers can be sent into the coating and developing treatment apparatus 1 to start treatments for the wafers. Further, since the transfer to the units in the treatment unit groups G1, G2, G6 and G7 is omitted and the wafers W are collected using the treatment unit groups G3 to G5 which are linearly arranged in the above example, the collection path can be made linear to reduce the collection time.

Note that, in the above example, the units to which the transfer of the wafer W is omitted are not limited to those in the above-described example. For example, the transfer of the wafer W to the units in a predetermined zone that the first wafer W in a lot has not passed through yet in terms of the transfer route at the time point of occurrence of trouble may be omitted. In this case, when the first wafer W has reached the cooling unit 90 in the fifth treatment unit group G5 along the transfer route shown in FIG. 4 at the time point of occurrence of trouble, all of the units from the cooling unit 90 to the post-exposure baking unit 94 in the same fifth treatment unit group G5 on the transfer route at the normal time may be omitted. The wafers W in that lot may be returned from the cooling unit 90, for example, along the collection path shown in FIG. 6 via the cooling unit 80, the cooling unit 81, and the transition unit 71 into the cassette C.

Further, for collection of the wafers W at the time of occurrence of trouble, it is also adoptable to make it possible to select either the wafer collection function of linearly collecting the wafers W into the cassette station 2 not along the above-described transfer route at the normal time, or the wafer collection function of collecting the wafers W taking a shortcut along the transfer route at the normal time.

In the control unit 160 described in the above embodiment, a wafer collection function may be set which is capable of collecting, at the time of occurrence of trouble, the wafers W without collecting only the wafer W remaining in the treatment unit which is the cause of trouble and collecting the wafer W in that treatment unit after the trouble is solved. In this case, when the wafer collection function is operated by the control unit 160 when a trouble occurs, for example, in the resist coating unit 40 and a wafer W is housed in the resist coating unit 40, the wafers W except the wafer W in the resist coating unit 40 are collected. In this event, the operator carries out repair work to the resist coating unit 40. When the wafer collection function is operated again by the control unit 160 after the resist coating unit 40 is restored, the wafer W remaining in the resist coating unit 40 is collected into the cassette station 2. In this case, the wafer W in the treatment unit which is the cause of trouble can also be collected using the wafer collection function in the coating and developing treatment apparatus 1 after the trouble is solved. Further, since the wafers W except the wafer W existing in the treatment unit which is the cause of trouble can be collected early, the wafer treatment can be resumed using the treatment units other than the treatment unit which is the cause of trouble.

While one example of the embodiment of the present invention has been described, the present invention is not limited to this example but may take various aspects. For example, the kinds, the numbers, and the arrangement of the units such as the transfer units and the treatment units in the coating and developing treatment apparatus 1 described in the present embodiment are not limited to those. Further, the present invention is not limited to the coating and developing treatment apparatus 1, but is also applicable to other substrate treatment apparatus such as an etching apparatus, a film-forming apparatus, a cleaning apparatus, and so on. Furthermore, the present invention is also applicable to a treatment apparatus for a substrate other than the semiconductor wafer, such as a substrate for an FPD (Flat Panel Display), and a glass substrate for a photomask and so on.

INDUSTRIAL APPLICABILITY

According to the present invention, the invention is useful in resuming the substrate treatment early when a trouble occurs in a substrate treatment apparatus.

What is claimed:

1. A substrate collection method of collecting substrates in a substrate treatment apparatus to a transfer-in/out section, the substrate treatment apparatus including the transfer-in/out section for transferring substrates in/out, a treatment section including a plurality of treatment units for treating substrates, and a substrate transfer unit that sequentially transfers substrates transferred-in from the transfer-in/out section to the treatment units in the treatment section and returns substrates subjected to predetermined treatments in the treatment section to the transfer-in/out section, the substrate collection method comprising:

during normal operation, transferring substrates into the transfer-in/out section by the substrate transfer unit to the plurality of treatment units along a predetermined transfer route, and responsive to a trouble occurring in the substrate treatment apparatus, transferring to and collecting at the transfer-in/out section all substrates existing in the substrate treatment apparatus by the substrate transfer unit along a modified predetermined transfer route with a predetermined treatment unit on the predetermined transfer route being omitted, the collecting being delayed for substrates that are undergoing treatment in one of the treatment units when the trouble occurs until after the treatment in said one of the treatment units is finished.

2. The substrate collection method as set forth in claim 1, the collecting further including collecting a substrate which is being subjected to a solution treatment in a solution treatment unit included in the treatment section after the solution treatment is finished and the substrate is dried.

3. The substrate collection method as set forth in claim 1, the collecting further including collecting a substrate which is being subjected to a heat treatment in a thermal treatment unit included in the treatment section after the heat treatment is finished and the substrate is cooled.

4. The substrate collection method as set forth in claim 1, further comprising, responsive to the trouble occurring in the substrate treatment apparatus, delaying the collecting of a substrate existing in a treatment unit which is a cause of the occurrence of the trouble but collecting all other substrates existing in the substrate treatment apparatus, and collecting the substrate existing in the treatment unit which is the cause of the occurrence of the trouble using the substrate transfer unit after the trouble is solved.

5. A substrate collection method of collecting substrates in a substrate treatment apparatus to a transfer-in/out section, the substrate treatment apparatus including the transfer-in/out section for transferring substrates in/out, a treatment section including a plurality of treatment units for treating substrates, and a substrate transfer unit that sequentially transfers substrates transferred-in from the transfer-in/out section to the treatment units in the treatment section and returns substrates subjected to predetermined treatments in the treatment section to the transfer-in/out section, the substrate collection method comprising:

during normal operation, transferring substrates into the transfer-in/out section by the substrate transfer unit to the plurality of treatment units along a predetermined transfer route, and responsive to a trouble occurring in the substrate treatment apparatus, transferring all substrates existing in the substrate treatment apparatus by the substrate transfer unit, not along the predetermined transfer route, but from a position of each substrate at the time of occurrence of the trouble in a direction toward the transfer-in/out section, and collecting the substrates at the transfer-in/out section, the collecting being delayed for substrates that are undergoing treatment in one of the treatment units when the trouble occurs until after treatment in said one of the treatment units is finished.

6. The substrate collection method as set forth in claim 5, the transferring further including, responsive to the trouble occurring in the substrate treatment apparatus, transferring a substrate existing in a treatment unit in the treatment section by the substrate transfer unit to an empty treatment unit closer to the transfer-in/out section.

7. The substrate collection method as set forth in claim 6, the transferring further including transferring the substrate existing in the treatment unit to an empty treatment unit which is closest to the substrate.

8. A substrate treatment apparatus comprising:

a housing;

a transfer-in/out section for transferring substrates in/out;

a treatment section including a plurality of treatment units for treating substrates;

a substrate transfer unit that sequentially transfers substrates transferred-in from the transfer-in/out section to the treatment units in the treatment section and returns substrates subjected to predetermined treatments in the treatment section to the transfer-in/out section, the substrate transfer unit, during normal operation, transferring substrates to said plurality of treatment units along a predetermined transfer route; and a substrate collection control unit which controls said substrate transfer unit, the substrate collection control unit, responsive to a trouble occurring in said substrate treatment apparatus, controlling the substrate transfer unit to transfer all substrates existing in the housing to said transfer-in/out section, controlling the substrate transfer unit to collect all the substrates at said transfer-in/out section, delaying controlling the substrate transfer unit to collect substrates undergoing treatment in one of the treatment units at the time of occurrence of the trouble until after treatment in said one of the treatment units is finished, and controlling the substrate transfer unit to transfer substrates in said housing along a modified predetermined transfer route with a predetermined treatment unit on the predetermined transfer route being omitted.

9. The substrate treatment apparatus as set forth in claim 8, wherein said treatment section includes a solution treatment unit for performing a solution treatment, and wherein said substrate collection control unit controls said substrate transfer unit to collect a substrate which is being subjected to the solution treatment in said solution treatment unit at the time of the occurrence of the trouble after the solution treatment is finished and the substrate is dried.

10. The substrate treatment apparatus as set forth in claim 8, wherein said treatment section includes a thermal treatment unit for performing a heat treatment, and wherein said substrate collection control unit controls said substrate transfer unit to collect a substrate which is being subjected to the heat treatment in said thermal treatment unit at the time of the occurrence of the trouble after the heat treatment is finished and the substrate is cooled.

11. The substrate treatment apparatus as set forth in claim 8, wherein, responsive to the trouble occurring, said substrate collection control unit controls said substrate transfer unit to delay collecting a substrate existing in a treatment unit which is a cause of the occurrence of the trouble but to collect all other substrates existing in the substrate treatment apparatus, and said substrate collecting control unit controls said substrate transfer unit to collect the substrate existing in said treatment unit which is the cause of the occurrence of the trouble after the trouble is solved.

12. A substrate treatment apparatus comprising:

a housing;

a transfer-in/out section for transferring substrates in/out;

a treatment section including a plurality of treatment units for treating substrates;

a substrate transfer unit that sequentially transfers substrates transferred-in from the transfer-in/out section to the treatment units in the treatment section and returns substrates subjected to predetermined treatments in the treatment section to the transfer-in/out section, the substrate transfer unit during normal operation, transferring substrates to said plurality of treatment units along a predetermined transfer route; and a substrate collection control unit for controlling said substrate transfer unit, the substrate collection control unit, responsive to a trouble occurring in said substrate treatment apparatus, controlling the substrate transfer unit to transfer and collect at said transfer-in/out section all substrates existing in the housing at said transfer-in/out section, delaying controlling the substrate transfer unit to collect substrates undergoing treatment in one of the treatment units at the time of occurrence of the trouble until after the treatment in said one of the treatment units is finished, and controlling the substrate transfer unit to transfer substrates in the housing, not along the predetermined transfer route, but from a position of each substrate in a direction toward said transfer-in/out section.

13. The substrate treatment apparatus as set forth in claim 12, wherein, responsive to the trouble occurring, said substrate collection control unit controls said substrate transfer unit to transfer a substrate existing in one of the treatment units in said treatment section to an empty treatment unit closer to said transfer-in/out section than said one of the treatment units.

14. The substrate treatment apparatus as set forth in claim 13, wherein said substrate collection control unit controls said substrate transfer unit to transfer the substrate existing in one of the treatment units to an empty treatment unit which is closest to the substrate.

* * * * *